United States Patent
Schwilch et al.

(10) Patent No.: US 6,411,093 B2
(45) Date of Patent: Jun. 25, 2002

(54) FREQUENCY GENERATOR FOR NMR APPLICATIONS WITH DIRECT DIGITAL FREQUENCY SYNTHESIS (DDS)

(75) Inventors: Arthur Schwilch, Bruetten (CH); Christoph Gosteli, Cambridge, MA (US)

(73) Assignee: Bruker BioSpin AG, Faellanden (CH)

( * ) Notice: Subject to any disclaimer, the term of this patent is extended or adjusted under 35 U.S.C. 154(b) by 0 days.

(21) Appl. No.: 09/780,406

(22) Filed: Feb. 12, 2001

(30) Foreign Application Priority Data

Feb. 19, 2000 (DE) .......................... 100 07 679

(51) Int. Cl.$^7$ ................................. G01V 3/00
(52) U.S. Cl. ...................... 324/322; 324/300
(58) Field of Search ................. 324/322, 321, 324/319, 318, 314, 312, 306, 307, 309, 300

(56) References Cited

U.S. PATENT DOCUMENTS

| | | | |
|---|---|---|---|
| 5,170,123 A | * 12/1992 | Holland et al. | ............. 324/322 |
| 5,436,600 A | 7/1995 | Van Heteren | |
| 5,546,001 A | 8/1996 | Miura | |
| 6,259,253 B1 | * 7/2001 | Ellingson | .................... 324/322 |

FOREIGN PATENT DOCUMENTS

EP 03 49 078 1/1990

OTHER PUBLICATIONS

Avance/Digital NMR, Bruker AG, Fällanden, Switzerland, Mar. 1999.
Crawforp et al. "Frequency Synthesizer Design Handbook", Artech House, Boston 1994, pp. 346.
Rohde, U.L., "Digital PLL Frequency Synthesizers Theory and Design", Prentice–Hall, Englewood Cliffs, 1983, pp. 110 ff.
F. Momo et al.: "Digital frequency sythesizers for nuclear magnetic resonance spectroscopy" Review of Scientific Instruments, vol. 65, 1994, pp. 3291–3292, XP 000474239.

* cited by examiner

*Primary Examiner*—Louis Arana
(74) *Attorney, Agent, or Firm*—Paul Vincent (57) ABSTRACT

A method of operating a high-resolution NMR spectrometer comprising a DDS generator containing an $NCO_L$ for generating an LO frequency, wherein the frequency of the $NCO_L$ is defined by inputting a numerical value Z, is characterized in that this numerical value Z may assume only values which satisfy the equation $Z=n \cdot N/m$, wherein Z, n, N, and m are integer and positive numbers, N is a power of 2 with a positive integer exponent, wherein said exponent represents the maximum number of bits during the calculation process, m is approximately $2 \cdot f_s/\Delta B$, n approximately $m \cdot f_{out}/f_s$ and m additionally a common integer divisor of $n \cdot N$ and $f_s$ is the clock frequency of the $NCO_L$, $\Delta B$ is the desired bandwidth with high spectral purity and $f_{out}$ is the output frequency of the $NCO_L$. This method allows the use of a DDS generator even in the case where very high spectral purity is required, wherein in particular quantization noise is largely eliminated over the frequency range relevant for NMR measurements.

15 Claims, 6 Drawing Sheets

FREQUENCY GENERATOR FOR NMR APPLICATIONS WITH DIRECT DIGITAL FREQUENCY SYNTHESIS (DDS)

This application claims Paris Convention priority of DE 100 07 679.3 filed Feb. 19, 2000 the complete disclosure of which is hereby incorporated by reference.

BACKGROUND OF THE INVENTION

The invention concerns a method of operating an NMR (=nuclear magnetic resonance) spectrometer, in particular a high-resolution NMR spectrometer, comprising a DDS (=direct digital synthesis) generator which contains an $NCO_L$ (=numerical controlled oscillator) for generating an LO (=local oscillator) frequency, e.g. the first LO frequency $f_{LO1}$, wherein the frequency of the $NCO_L$ is defined in the DDS generator through input of a numerical value Z.

An NMR spectrometer comprising such a DDS is disclosed in the company leaflet "AVANCE/Digital NMR" of Bruker AG, Fällanden, Switzerland, dated March 1999, wherein in particular page 11 shows a functional unit "DDS" performing as "frequency and phase control" in the CPU.

Frequency generators which operate with direct digital frequency synthesis, so-called DDS generators (DDS= Direct Digital Synthesis) are described e.g. in "Frequency Synthesizers Design Handbook", J. A. Crawford, Artech House, Boston, London, 1994, page 346 or in "Digital PLL Frequency Synthesizers. Theory and Design", U. L. Rohde, Prentice-Hall Inc., Englewood Cliffs, N.J. 1983, page 110.

The DDS generators have the following positive characteristics:

They generate numerical values with a clock rate given by an externally supplied constant clock frequency $f_s$, and the numerical values represent a signal of a desired frequency. This signal is subsequently converted in a DAC (=Digital to Analog Converter) into an analog signal which has actually the same frequency stability as the clock frequency and is therefore very stable. The frequency cannot be changed continuously, but only in discrete frequency steps which may be very small using current methods, i.e. in the milliherz range for output frequencies between 10 and 30 MHz thus allowing almost continuous frequency adjustment.

The DDS generators essentially require only digital IC components which keeps their manufacturing costs low. A very advantageous solution consists in that the entire DDS generator is integrated in one single ASIC component (ASIC=Application Specific Integrated Circuit) which can considerably reduce costs when a large number are produced and allows particularly dense packing of the functional digital elements. The latter is particularly advantageous in fast electronic processes which are increasingly required today.

These positive aspects of a DDS generator, however, face the serious drawback that the spectral purity of the output signal is no longer sufficient for today's standards. DDS generators have been successfully used for more than 10 years in NMR (=nuclear magnetic resonance) spectrometers. The demand for spectral purity of the LO signals has increased in such a way that these generators can no longer provide the high performance needed during the receiving phase of the NMR signal.

The insufficient spectral purity of the DDS generator is caused by the so-called quantizising noise which is due to the fact that the signal generated in the DDS generator is quantizised, i.e. represents a stepped approximation to the desired signal, wherein the numerical values of these steps are defined only with a finite accuracy given by the maximum number of available bits.

The quantizising noise decreases the larger the number of steps within one period and the higher the accuracy of the numerical values of said steps. The number of steps cannot be increased arbitrarily. There is a limit given by the maximum clock rate of the digital components.

NMR signals in high-resolution NMR often consist of very strong and at the same time very weak frequency components, wherein the weak components are frequently the significant ones. This means that the NMR signal has a large dynamic range. One of the most sensitive mixing stages in the NMR receiver is the first mixing stage which uses an LO signal ($f_{LO1}$) derived from the DDS generator and thus includes quantization noise. If this LO signal is mixed with the NMR signal, the quantization noise will be transferred particularly to the strongest frequency components of the NMR signal and will thus generate in the NMR spectrum a base line disturbed by unwanted frequency components. This disturbed base line also includes the desired weak frequency components of the NMR signal which are difficult to distinguish from the disturbing components. As a result, proper spectroscopy is impossible.

During the relatively uncritical transmitting phase in NMR spectroscopy, DDS generators are still used today without any problems.

However, during the critical receiving phase, the demand for spectral purity is very high today such that the DDS generator which provides the variable LO frequency does no longer meet these demands due to the quantization noise described above. Up to now, no practicable method has been available to reduce said quantization noise. Therefore, in all critical experiments which required high spectral purity, one had only the choice to do without this elegant and powerful generator or accept its disadvantages.

It is therefore the underlying purpose of the present invention to present a method comprising the initially mentioned features utilizing a DDS generator even when very high spectral purity is required, wherein particularly the quantization noise is eliminated as much as possible in the frequency range of the NMR spectrum.

SUMMARY OF THE INVENTION

In accordance with the invention, this object is achieved in a simple and effective way in that the numerical value Z is selected such that it assumes only values which satisty the equation $$Z = n \cdot N/m$$

wherein Z, n, N, and m are positive integers, wherein N is a power of 2 with a positive integer exponent, said exponent representing the maximum number of bits during the calculation process, wherein m is approximately $2 \cdot f_s/\Delta B$, n is approximately $m \cdot f_{out}/f_s$ and m a common integer divisor of $n \cdot N$ and wherein $f_s$ is the clock frequency of the $NCO_L$, $\Delta B$ the desired bandwidth with high spectral purity and $f_{out}$ the output frequency of the $NCO_L$.

According to the inventive teaching, it is not allowed to use arbitrary but only selected Z values for the input to the DDS generator. As a result, the lowest occurring disturbing frequency will always be larger than the repetition frequency $\Delta f_{Raster}$ at which the signal of the $NCO_L$ repeats itself exactly. In this way it is possible to select the above described disturbing components with a sufficient separation to ensure that the NMR spectrum in between remains undisturbed.

In a variant of the inventive method which is particularly easy to carry out and is thus used with particular preference, m is a power of 2 having a positive integer exponent. This considerably simplifies the calculations to be carried out in the inventive method with respect to the general case and as a result the amount of calculations needed is reduced considerably.

The method is particularly facilitated in a further development of the above-mentioned variant, wherein the calculation of Z is carried out in the following three stages.

(a) the value for m is determined by means of the equation $$m = 2^{RndDwn\{log[2fs/\Delta B]/log\ 2\}}$$

wherein $\Delta B$ is the desired bandwidth of high spectral purity, $f_s$ is the clock frequency of the NCO and RndDwn is a rounding-off process to the next smaller integer value;

(b) the value for n is determined through equation $$n = Rnd(m \cdot f_{out}/f_s)$$

wherein $f_{out}$ is the desired frequency of the NCO, m the value calculated in the first stage and Rnd a rounding-off process to the next integer value;

(c) the value for Z is determined through equation $$Z = n \cdot N/m$$

wherein N is defined in claim 1 and m and n are the values determined in stages (a) and (b).

The present invention also includes a DDS (=Direct Digital Synthesis) generator for application in NMR spectrometers, in particular high-resolution NMR spectrometers comprising an $NCO_L$ (=Numerical Controlled Oscillator) for generating an LO (=Local Oscillator) frequency $F_{LO1}$ which is characterized in that the DDS generator contains several NCOs for generating a transmitting frequency. If at least two NCOs are present, one can be utilized for supplying the phase information for detecting the FID signal and the other one for changing the transmitting frequency during the transmitting phase.

A preferred embodiment of the inventive DDS generator is characterized in that the $NCO_L$ has a clock frequency $f_s$ which meets the condition $f_s = 2^k \cdot f_0$ wherein k is a positive integer and $f_0$ is the base frequency from which all LO frequencies, except for two, namely $f_{LO1}$ for a mixing stage and the LO frequency for a DQD (=Digital Quadrature Detector) are derived such that they are an integer multiple of $f_0$. As a result, the disturbing components generated in the subsequent mixing stages are identical with the grid components of the $NCO_L$.

One further development of the invention is particularly preferred wherein one of the NCOs oscillates continuously and can provide a reference phase for all other NCOs by transferring its actual phase to the other NCOs via switches thereby achieving an exact definition of the initial phase of the FID signal and allowing phase synchronism for several successive FID signals.

A further particularly preferred embodiment of the inventive DDS generator is characterized in that a saw tooth to sinusoidal signal transformer is provided for transforming the saw tooth signal of an NCO into a sinusoidal signal and in that a further saw tooth to cosine signal transformer is provided for transforming the saw tooth signal of this NCO into a cosine signal thereby producing two channels which are in quadrature with one another and can be used in a subsequent frequency synthesizer for a quadrature mixing stage. A quadrature mixing stage produces considerably less undesired mixing components compared to a normal mixing stage.

One embodiment is also preferred which preferably comprises digital multiplicators which are fed with signals from signal transformers and where the desired amplitude dependence is achieved by a numerical calculation process during the transmitting phase. In this way, a digital amplitude modulator can be produced with simple means which has a much higher precision than an analog modulator.

One further embodiment of the inventive DDS generator is also preferred which comprises an attenuator whose phase and attenuation errors can be compensated in that the phase errors are stored as a function of the desired attenuation value in a first memory and that the attenuation errors are stored as a function of the desired attenuation value in a further memory and in that during setting of a desired attenuation value, the associated phase error is added with reverse signs to the current signal in one adding stage, and the corresponding attenuation error with reverse signs is added to the desired attenuation value and supplied to the attenuator. Registration of the attenuation errors can thus allow mathematical pre-compensation of the signals thereby obtaining the desired attenuation values practically without phase and attenuation errors.

One method is also advantageous for operating an inventive DDS generator with DQD which is characterized in that during the receiving phase, exact positioning of the NMR spectrum in the low frequency range is not effected via $NCO_L$ but by means of the numerical value $Z_Q$ in the DQD. This allows fine adjustment of the NMR spectrum to a desired frequency range without generating additional disturbing components.

Further advantages of the invention can be extracted from the description and the drawing. The features mentioned above and below can be utilized in accordance with the invention either individually or collectively in any arbitrary combination. The embodiments shown and described are not to be understood as exhaustive enumeration but rather have exemplary character for describing the invention.

The invention is shown in the drawing and further explained by means of embodiments.

BRIEF DESCRIPTION OF THE DRAWING

FIG. 1b shows the frequency spectrum associated with FIG. 1a;

DESCRIPTION OF THE PREFERRED EMBODIMENT

Figure 2:
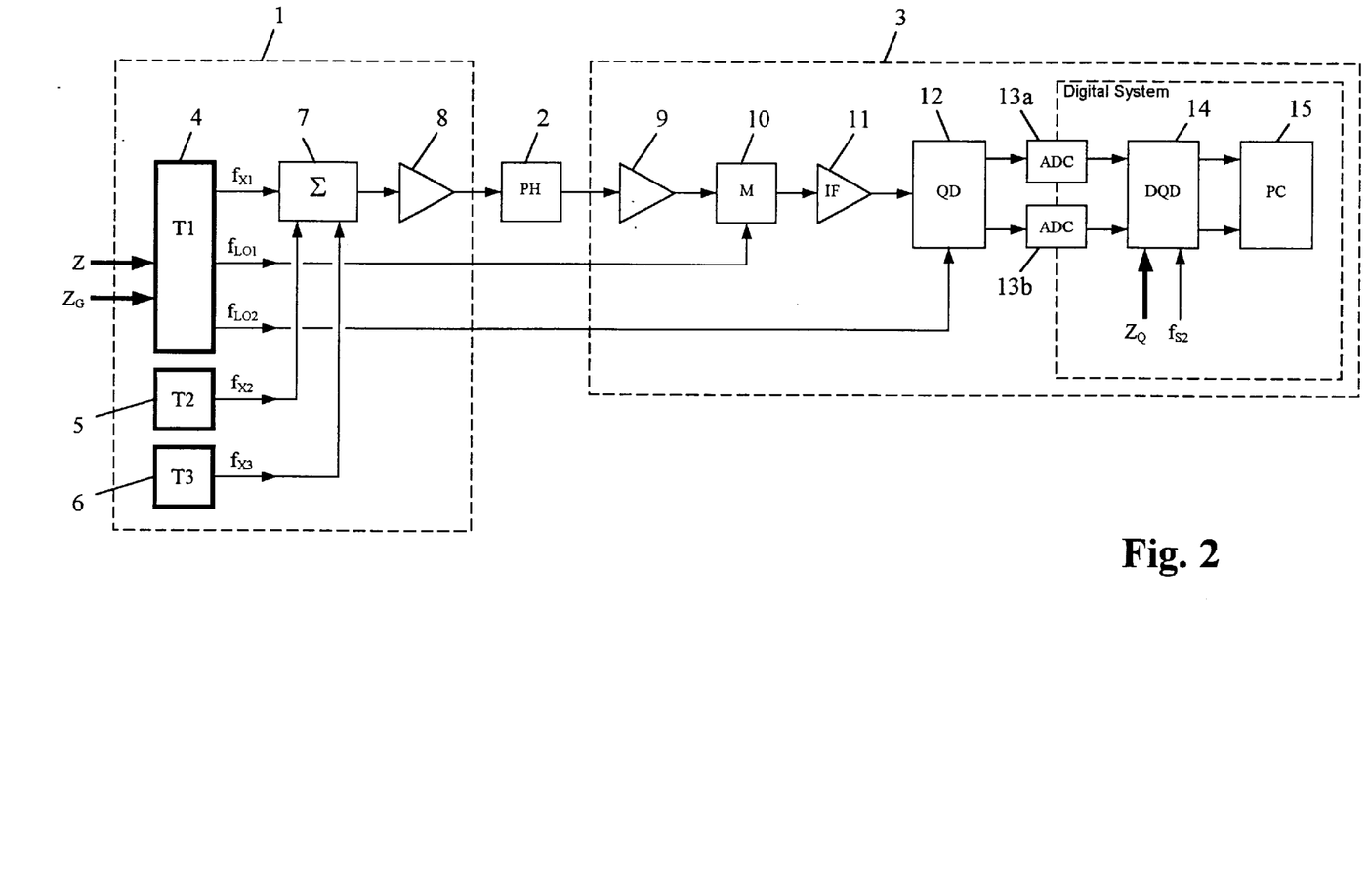
FIG. 2 shows the schematic construction of a modern NMR spectrometer according to prior art.

FIG. 2 shows the block diagram of a modern NMR spectrometer. The individual parts are explained below:

1. transmitting section
2. probe head
3. receiving section
4. main transmitting unit T1 which supplies at the same time the required LO frequencies $f_{LO1}$ and $f_{LO2}$
5. second transmitting unit T2 for exciting a second range of nuclei
6. third transmitting unit T3 for exciting a third range of nuclei
7. adding component for adding the output signals of the three transmitters and leading same to the output transmitter 8
8. power transmitter for producing high power excitation signals
9. pre-amplifier with high signal-to-noise-ratio
10. first mixer stage which uses the frequency-variable LO1
11. IF-amplifier (e.g. at 20 MHz)
12. quadrature detector which uses the fixed LO2 (e.g. 20 MHz)
13a, 13b analog-to-digital converter for the two output signals of the quadrature detector 12
14 digital quadrature detector (DQD=Digital Quadratur Detector) whose LO is given by the numerical value $Z_Q$. It operates with a clock frequency of $f_{s2}$
15 computer for calculating i.a. the Fourier transformation of the two quadrature signals from the DQD 14

Figure 3:
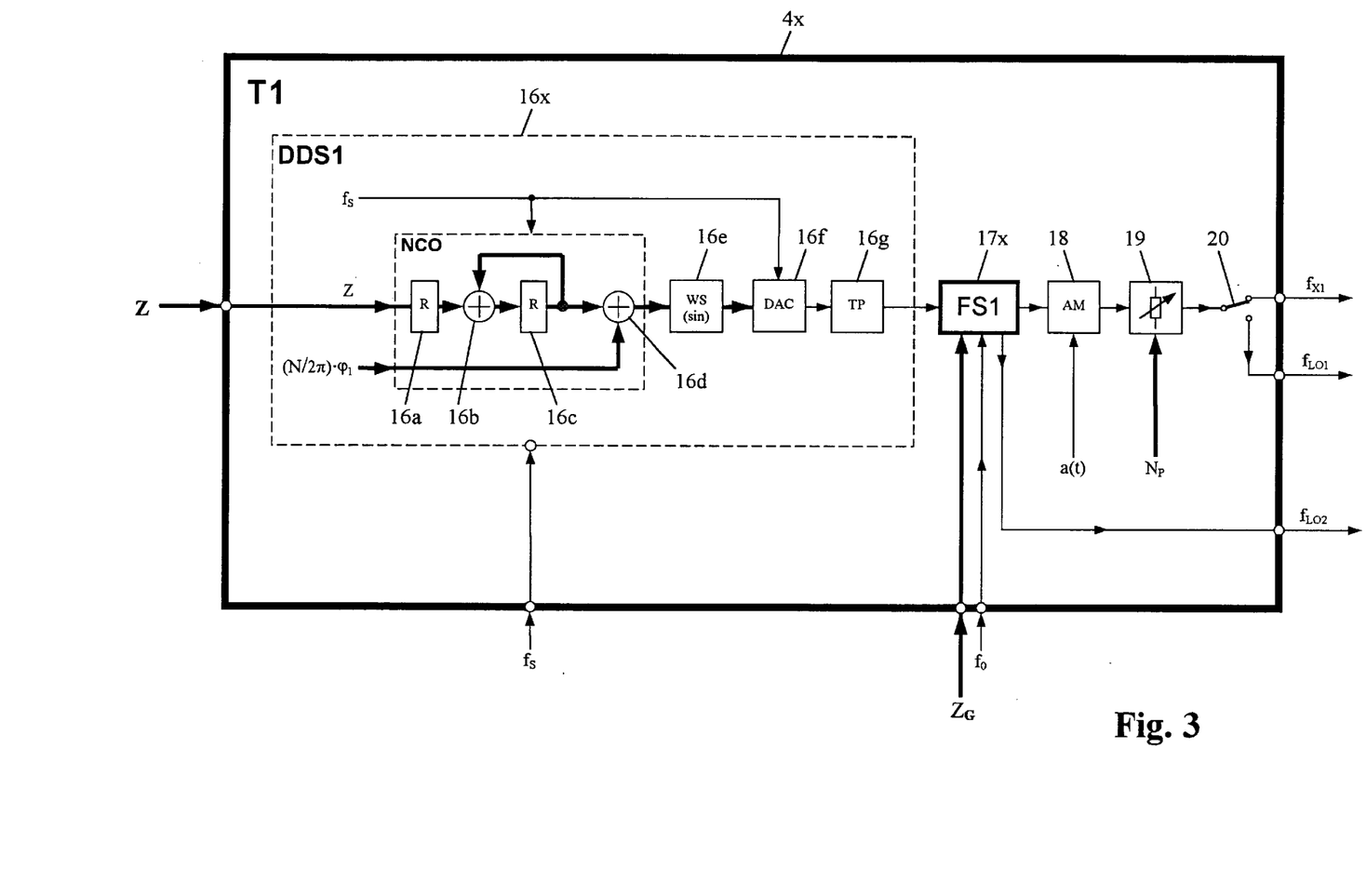
FIG. 3 shows an operational diagram of the main transmitting unit T1 of an NMR spectrometer according to prior art.

FIG. 3 shows a known circuit of the main transmitting unit T1. The associated DDS generator is controlled via the input Z in a conventional manner and therefore generates disturbing components. By changing the synthesizer frequency by means of the numerical value $Z_G$ and subsequent adjustment of the DDS frequency, one has to try to find a combination where the disturbing components in the spectral range are as small as possible and therefore have minimum disturbing effect.

The individual parts of the main transmitting unit T1 are explained below:

4× main transmitting section T1 of an NMR spectrometer according to prior art

Figure 5A:
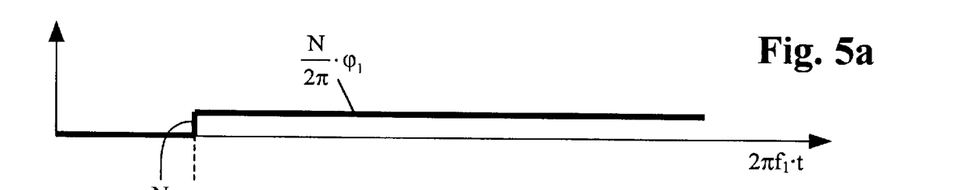
FIG. 5a shows a signal at the phase entry of the NCOs.
Figure 5B:
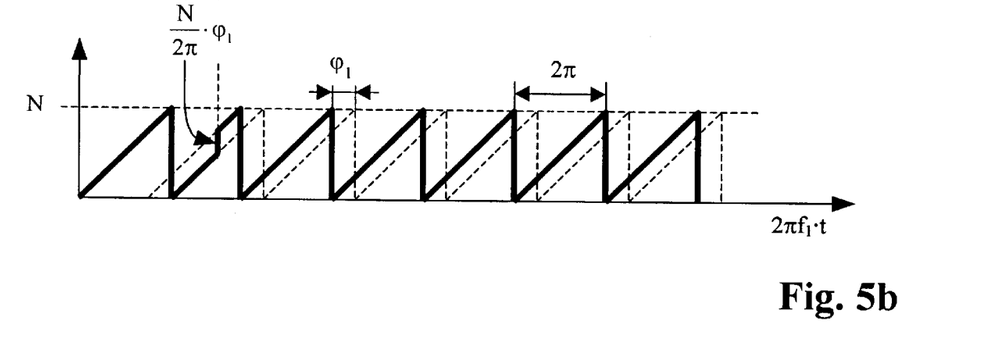
FIG. 5b shows the influence of the phase signal of FIG. 5a on the output signal of the NCOs.
Figure 6A:
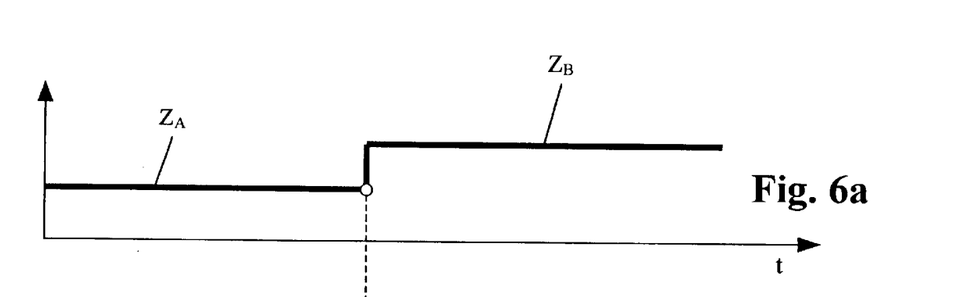
FIG. 6a shows the signal at the frequency entry of the NCOs.
Figure 6B:
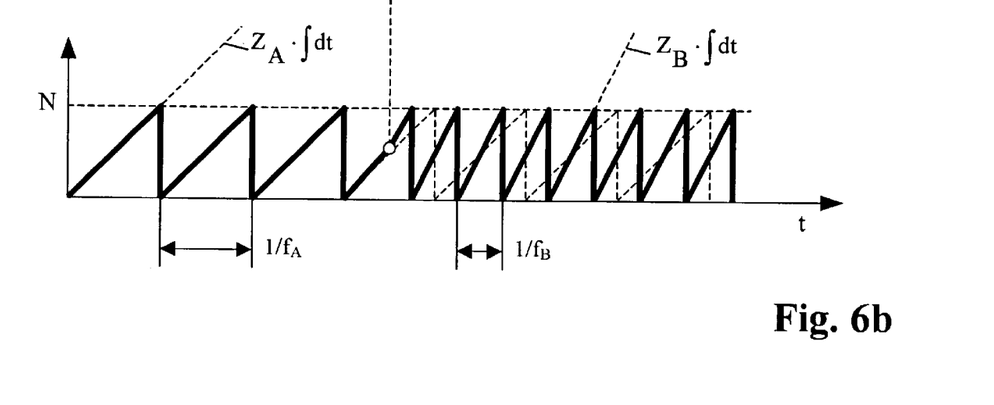
FIG. 6b shows the influence of the frequency signal of FIG. 6a on the output signal of the NCOs.

16× DDS generator whose output frequency lies e.g. in the range of 5 to 10 MHz 16a register for storing the numerical value Z in the NCO 16b adding stage for adding the numerical value Z to the value of the accumulator 16c, with a repetition rate given by the clock frequency $f_s$ 16c register which works as accumulator and at the same time generates the output of the NCO. The signal thereby produced is shown in FIG. 6b. The larger the numerical value Z (e.g. $Z_A$, $Z_B$) the faster the value in the accumulator increases and the higher the frequency of the saw-tooth 16d adding stage for producing a phase jump $(N/2\pi)\cdot\phi_1$ in the output signal of the NCO. This process is shown in FIGS. 5a and 5b 16e signal transformer for converting the saw tooth signal from the NCO into a sinusoidal signal 16f digital-to-analog converter 16g low-pass filter which is required in every sampling process for suppressing the clock frequency $f_s$ and its harmonics and the mirror signal generated by the clock frequency 17x frequency synthesizer for upwardly mixing the frequency of the DDS generator by means of the numerical value $Z_G$ to the desired frequency $f_{x1}$ during the transmitting phase, resp. $f_{LO1}=f_{x1}-f_{LO2}$ during the receiving phase. $f_0$ is the base frequency (e.g. 5 MHz) and $f_{LO2}$ is the fixed LO frequency of the second LO (e.g. 20 MHz)

18 amplitude modulator for generating the desired amplitude shape of the transmitting pulses 19 attenuator for adjusting the transmitting power to the desired value by means of the numerical value $N_p$ 20 switch for switching the transmitting signal during the transmission phase to the transmitting channel $f_{x1}$ and during the receiving phase to the LO channel $f_{LO1}$.

Determination of the numerical value Z at the entry of the NCO in accordance with the invention is described below:

Considering the fact that an NMR spectrum requires only a very limited frequency range, with protons e.g. only approx. 50 to 100 ppm of the mean NMR frequency, it is possible to operate the DDS generator such that its spectrum is very pure in the desired frequency range and outside of this range may generate disturbing components. Under this condition, it is actually possible to use DDS generators which meet the high demands on stability and purity in high-resolution NMR spectroscopy.

The inventive idea combines two findings. Firstly, the DDS generator must have a pure spectrum only within a limited frequency range and secondly, there are possibilities to operate the DDS generator such that its spectrum is very pure within this limited frequency range.

The DDS generator operated in this fashion, provides in addition to the desired frequency, a grid of additional, however much smaller frequency components which appear at identical intervals. The interval is selected such that it can accommodate half the NMR spectrum (halving since quadrature detection is assumed). The desired frequency is then identical to one of the components of the grid and can be shifted in discrete steps from one component of the grid to the next.

Figure 1A:
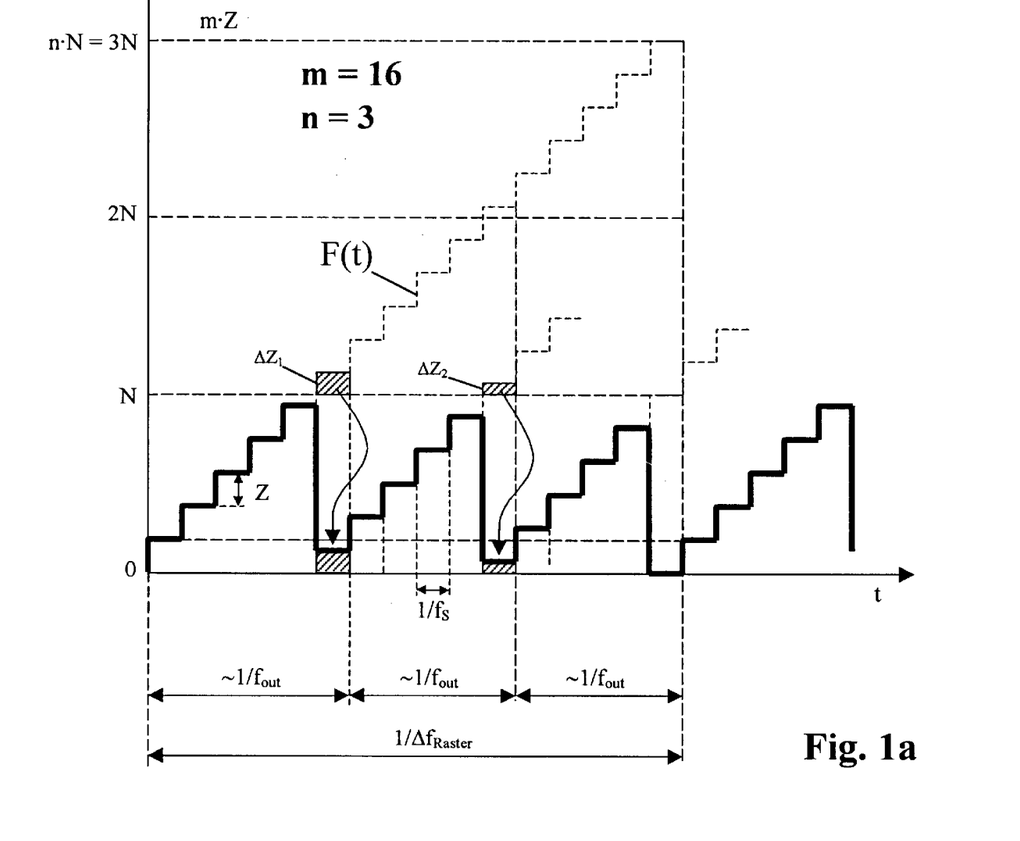
FIG. 1a shows the time function of the output signal of a DDS generator operating in accordance with the invention.

How has the DDS generator to be operated in order to show such behavior? To answer this question, the NCO (=Numeric Controlled Oscillator) in the DDS generator has to be examined more closely in order to explain how the grid components are generated. FIG. 1a shows the required time function of the output signal to achieve the desired result. The associated frequency spectrum is shown in FIG. 1b.

In FIG. 1a the step height Z of the step function F(t) has been selected such that exactly m steps fit within the range n·N. This is the decisive condition because then the output signal repeats itself after m periods of the clock frequency $f_s$ and therefore cannot have any disturbing components with a smaller frequency separation than the repetition frequency $\Delta f_{Raster}=f_s/m$.

Figure 1B:
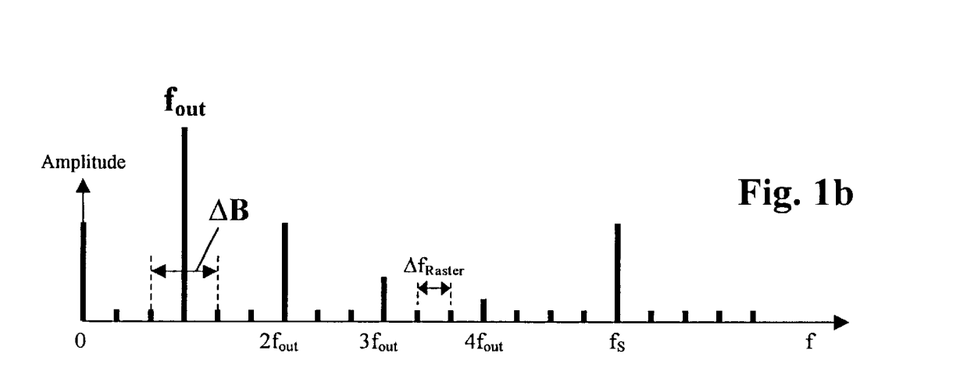

The disturbing components represent a frequency grid having a grid separation of $\Delta f_{Raster}$ (see FIG. 1b). The spectral purity between these grid components is high and thus very suitable for NMR spectroscopy.

The output frequency $f_{out}$ and the clock frequency $f_s$ of the NCO are positioned exactly on such grid frequencies. In the present example we have n=3 and therefore the output frequency $f_{out}$ is positioned on the third grid component and because of m=16, the clock frequency $f_s$ is positioned on the $16^{th}$ grid component.

The individual terms mentioned in FIGS. 1a and 1b are individually described below:

$f_{out}$ output frequency of the NCO $f_s$ clock frequency of the NCO $\Delta f_{Raster}$ frequency separation between adjacent components of the frequency grid and exact repetition frequency of the time function.

ΔB see FIG. 1b. Frequency range (bandwidth) on the left and right side of the output frequency $f_{out}$ which exhibits the desired high spectral purity and can be received by means of a quadrature detector n number of periods of $f_{out}$ after which an exact repetition of the output signal of the NCO is achieved m number of periods of $f_s$ after which an exact repetition of the output signal of the NCO is achieved Z positive integer value which is stored in the input register of the NCO, is integrated therein by the NCO and produces a saw-tooth shaped signal at its output N numerical value determined by the maximum number of bits used in the NCO. If same is e.g. 34 bit, then $N=2^{34}$. This value determines the precision of the calculation process. As soon as the NCO assumes this value or exceeds it during integration, it is set to zero and the excess value is added. The highest possible numerical value from the NCO is $(2^{34}-1)$ since this is the highest value which can be represented with 34 bits.

Moreover, two further terms N1 and m1 are introduced and defined below:

N1=maximum number of bits used in the NCO calculations. This value defines the numerical value $N=2^{N1}$ M1 =positive integer exponent of 2 for the definition of the number $m=2^{m1}$ Four conditions can be derived from FIG. 1a which have to be met in order to obtain a signal from the NCO with the desired time dependence and thus the required spectral purity:

Condition 1: $m \cdot Z = n \cdot N$

Condition 2: $(1/\Delta f_{Raster}) = m(1/f_s)$

Condition 3: $(1/\Delta f_{Raster}) = n(1/f_{out})$

Condition 4: m, n, N, and Z must be integer values

The first condition can be derived by means of the function F(t) in FIG. 1a and is the central condition of the inventive idea. It defines the numerical value Z which must be supplied to the NCO for integration to obtain the desired frequency $f_{out}$ and the desired bandwidth ΔB:

$$Z = n \cdot N/m \quad [1a]$$

Since Z must be an integer (see condition 4) m must be a common divisor of n·N. Thus, the following conditions must be valid:

$$Z = n \cdot N/m \quad [1b]$$

wherein:

n, N and m are integer and positive values

N>m>n

N=power of 2 m=common divisor of n·N

If m is selected as power of 2 with an positive integer exponent m1, one obtains an integer value for Z as well. This is a special case which does not comprise all possibilities of equation 1b but offers sufficient possibilities for practical use and is easier to handle:

$N=2^{N1}$ $M=2^{m1}$ $Z=n \cdot N/m = n \cdot 2^{N1}/2^{m1} = n \cdot 2^{N1-m1}$ Since N>m and thus N1>m1, the above value for Z is always an integer. As a result, the following conditions must be valid:

$$Z = n \cdot N/m \quad [1c]$$

wherein n, N and m are integer and positive values

N>m>n

N and m are powers of 2

To obtain the desired values for the frequency $f_{out}$ and the bandwidth ΔB, one has to select specific values for m and n which can be calculated by means of the two conditions 2 and 3 which were derived through the time axis in FIG. 1a:

$\Delta f_{Raster} = \Delta B/2$ entered into condition 1:

$2/\Delta B = m/f_s$ $m = 2f_s/\Delta B = 2^{m1}$ $m1 = \log(2f_s/\Delta B)/\log 2$ Since m1 should be an integer, the above term must be rounded, and if the resulting bandwidth should not be smaller than the given bandwidth ΔB rounding off to the next lower value is required (=RndDwn):

$m1 = \text{RndDwn}\{\log(2f_s/\Delta B)/\log 2\}$ $$m = 2^{\text{RndDwn}\{\log(2f_s/\Delta B)/\log 2\}} \quad [2]$$

From conditions 2 and 3:

$m/f_s = n/f_{out}$ $2/\Delta B = n/f_{out}$ $n = m \cdot f_{out}/f_s$

Since n must also be an integer (condition 4), the above term must be rounded to the nearest integer number (=Rnd):

$$n = \text{Rnd}(m \cdot f_{out}/f_s) \quad [3]$$

Calculation of Z is thus possible in three stages:

Stage 1: $m = 2^{\text{RndDwn}\{\log[(2f_s/\Delta B)/\log 2]\}}$

Stage 2: $n = \text{Rnd}(m \cdot f_{out}/f_s)$

Stage 3: $Z = n \cdot N/m \quad [4]$ wherein:

RndDwn=round off to the next lower integer number

Rnd=round off or up to the nearest integer number

EXAMPLE

Given:

$N=2^{34}$(34 bit calculation accuracy)

$f_s$=80 MHz

Desired:

ΔB=9 kHz $f_{out}$=16.3410 MHz

Calculation result:

$m=2^{14}=16{,}384$ n=3,347

$Z=3{,}347 \cdot 2^{20}=3{,}347 \cdot (1{,}048{,}576)$

Since rounding off was necessary, the predetermined values for $f_{out}$ and ΔB are not met exactly:

fout=n·$f_s$/m=3,347·80/16,384 MHz=16.34277

ΔB=2·fs/m=2·80,000/16,384=9.765625 kHz

The output frequency is larger by 1.77 kHz and the bandwidth ΔB is larger by 0.765625 kHz than required. The desired values are thus not met exactly but a frequency band of ΔB is given which allows clear NMR spectroscopy. Exact adjustment of the output frequency is nevertheless required and has to be achieved by other means as will be described later on.

The differences between the transmitting phase and the receiving phase are as follows.

Since the excitation of the NMR signal does not demand high spectral purity of the excitation signal, all DDS generators which generate the required transmitting frequencies, can be designed according to current prior art. Such DDS generators allow easy and fine adjustment of the frequency and thus the positioning of the transmitting frequency in the center of the NMR spectrum.

The case is completely different during the receiving phase. The DDS generator is used for generating the LO frequency $f_{LO1}$. Since its spectrum must be very pure, the Z values for the associated NCO can assume only the inventive values for preventing disturbing components in the desired frequency range. As a result, the frequency of the DDS generator can be adjusted only in stages of $\Delta f_{Raster}$ which makes fine adjustment of the frequency impossible.

Fine adjustment of the frequency during the receiving phase is nevertheless possible as described below, in particular how the NMR spectrum is positioned exactly in the desired low frequency range:

Basically it is possible to use each of the LO frequencies for positioning the NMR spectrum exactly in the desired low frequency range. It is not absolutely necessary to use the LO frequency $f_{LO1}$. However, not all of the other LO frequencies are suitable since exact frequency adjustment leads in most cases to a loss of spectral purity. One LO frequency is particularly suited in this case, i.e. the one which belongs to the DQD 14 (Digital Quadratur Detector; see FIG. 2) at the very end of the receiving chain and is defined with the value $Z_Q$. The fact that same has the lowest frequency of all LO frequencies and is generated purely digitally, its signal can be generated with high accuracy and practically without disturbing sidebands. This LO allows positioning of the NMR spectrum with the required accuracy in the low frequency range without deterioration of the spectral purity.

The DQD belongs to prior art and is essentially a digital quadrature mixing stage which mixes the NMR spectrum mathematically down such that its center is positioned at the frequency zero.

Finally it is important to note that the quadrature mixing stage 12 before the DQD does not mix the NMR spectrum exactly to zero for the following two reasons: firstly, due to the roughness of the grid $\Delta f_{Raster}$ of the first LOs and secondly since this would not be desirable since normally, the region about the frequency zero is strongly disturbed by the influences of mains lines, laboratory equipment, flicker-noise etc. The subsequent DQD however does mix the NMR spectrum down to zero but this process is carried out mathematically thereby avoiding any further disturbing components.

Figure 4:
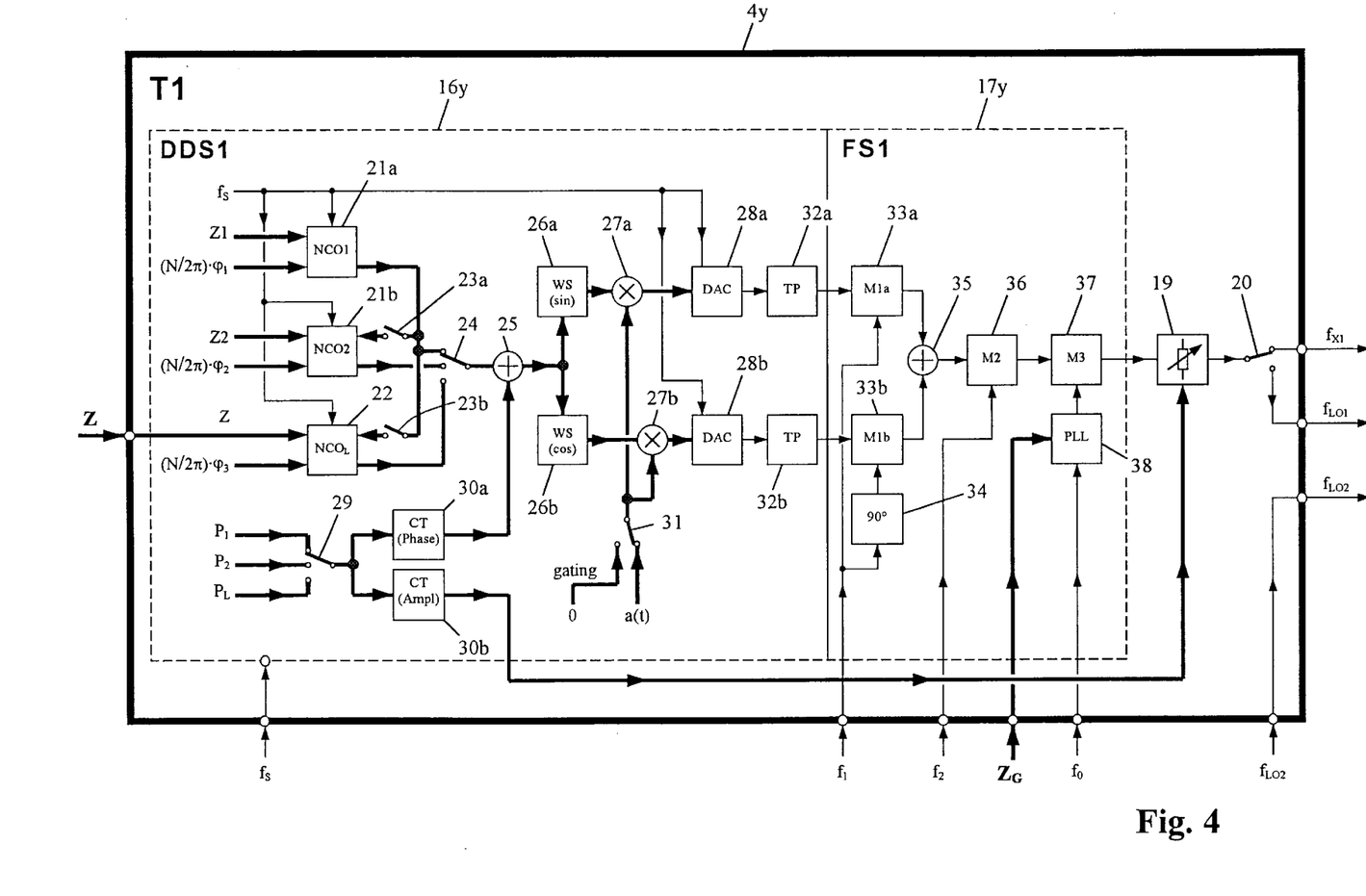
FIG. 4 shows a schematic design of a main transmitting unit in accordance with the invention.

The positioning of the NMR spectrum about the frequency zero is carried out at three different positions by means of rough, fine and finest steps as described below:

1. The largest frequency steps of fo (e.g. 5 MHz) are generated by the numerical value $Z_G$ in the synthesizer 17y.
2. The $NCO_L$ 22 in the DDS generator 16y provides the finer steps using the numerical value Z.
3. The DQD 14 generates the finest steps using the numerical value $Z_Q$.

The conditions for the LO frequencies for preventing any additional disturbing components are further explained below:

Even if the first LO frequency $f_{LO1}$ does not have any disturbing components in the desired frequency range due to the selected Z values, it is still possible that all other LO frequencies in the associated mixing processes produce additional disturbing components. To prevent this, they have to meet certain conditions which are defined below:

The LO frequencies in the frequency synthesizer 17y ($f_1$, $f_2$ and $n3 \cdot f_0$) and in the receiver 3 ($f_{LO2}$) except for two, i.e. $f_{LO1}$ for the first mixing stage 10 and the LO frequency in DQD 14, are derived from the base frequency $f_0$ and are integer multiples of $f_0$. To prevent generation of additional disturbing components through mixing processes carried out with these Lo frequencies, except for those given by the grid $\Delta f_{Raster}$, it is sufficient that the base frequency $f_0$ is also an integer multiple p of the grid separation frequency $\Delta f_{Raster}$:

$$f_0 = p \cdot \Delta f_{Raster}$$

It can be shown that the above condition is automatically met if the clock frequency $f_s$ of the NCO is an integer multiple $2^K$ of $f_0$, wherein k is an integer and positive value:

$$f_s = 2^k \cdot f_0 \qquad [5a]$$

======

This can be easily shown:

$$f_0 = f_s/2^k = m \cdot \Delta f_{Raster}/2^k = 2^{m1} \cdot \Delta f_{Raster}/2^k$$

$$f_0 = 2^{(m1-k)} \cdot \Delta f_{Raster}$$

As long as $\Delta f_{Raster}$ is smaller or equal to $f_0$, m1 must be larger or equal to k and thus $2^{(m1-k)}$ must always be an integer.

In summary, the following conditions must be met to ensure that $f_0$ is an integer multiple of $\Delta f_{Raster}$ and consequently the mixing processes do not generate any additional disturbing components except for those given by the grid and having a separation frequency of $\cdot \Delta f_{Raster}$:

$$f_s = 2^k \cdot f_0 \qquad [5b]$$

wherein:

k=positive and integer value $\Delta f_{Raster} = f_s/m \leq f_0$

The generation of the quantizing grid at the output of the DDS generator is explained below:

The output signal of the $NCO_L$ has a saw-tooth shape which must be converted in the two components 25a and 25b into a sinusoidal and cosine function to ensure that essentially only one specific frequency component $f_{out}$ is generated. To explain this process, the output signal is multiplied with 2π/N whereby the numeral axis in FIG. 1a becomes the phase axis. The saw-tooth shaped phase curve of the $NCO_L$ may now be replaced by the step function F(t) due to the 2π periodicity. F(t) has the advantage of showing a monotonic behavior over the time period $1/\Delta f_{Raster}$. Next, the two sinusoidal output signals are obtained by calculating the sine and cosine function of the phase curve (2π/N)·F(t):

$$Z_{out1} = \sin[(2\pi/N) \cdot F(t)] \qquad [6a]$$

$$Z_{out2} = \cos[(2\pi/N) \cdot F(t)] \qquad [6b]$$

These two sinusoidal signals $Z_{out1}$ and $Z_{out2}$ already have a frequency spectrum which is much purer than the one shown in FIG. 1b. It could be even perfectly pure if calculation of the equations 6a and 6b could be carried out with the highest possible accuracy. Already an accuracy of 34 bits would be sufficient to make the spectrum of the two generated signals that clear that the grid components $\Delta f_{Raster}$ would be negligibly small and only the frequency components of the clock frequency $f_s$ and its harmonics and the mirror frequencies of the two signals generated by the clock frequency would be present as disturbing frequency components, but this is always the case in sampling processes. These disturbing components however do not represent a problem since they are completely eliminated in the two low-pass filters 32a and 32b.

Generation of a completely pure signal is easy to understand taking into consideration that the numerical values of the stepped phase curve $(2\pi/N) \cdot F(t)$ would be on an exact straight line. The gradient $d\phi/dt$ of this straight line would give exactly the desired angular frequency $2\pi \cdot f_{out}$.

Since the calculation process has a finite accuracy, the values of the steps are rounded off or up values and are not precisely on the exact straight phase curve. Deviations from the exact phase curve are called quantization noise which has nothing to do with noise in the common sense since the phase error repeats itself after each period $1/\Delta f_{Raster}$ and generates a periodic quantization signal which appears in the frequency spectrum as frequency grid having a separation $\Delta f_{Raster}$. In this case one would rather speak of a quantizing grid than a quantizing noise.

The sinusoidal signals therefore also produce a frequency grid just like the saw-tooth shaped signal only with much smaller amplitude values. Therefore, all previous calculations made on the basis of the saw-tooth function are also qualitatively valid for the sinusoidal signal.

As mentioned before, an accuracy of 34 bits would be sufficient to keep the grid components negligibly small. This would lead to a practically ideal DDS generator which would supply a frequency with a pure spectrum which could furthermore be finely adjusted. The above described theory for calculating discrete Z values for VCO would therefore no longer be required any more.

An accuracy of 34 bits however cannot be realized for dynamic reasons. The two sinusoidal functions cannot be calculated directly during the runtime since the digital components today are too slow. The sinusoidal function must therefore be available through discrete numerical values stored in a table and all intermediate values must be calculated through linear interpolation during the runtime. The latter is possible from the dynamic point of view since the linear interpolation is a much more simple calculation process in contrast to the calculation of the sinus function.

Unfortunately, the number of required values of the sinusoidal function increases with increasing calculation accuracy such that with an accuracy of 34 bits, the number of these values would result in an in admissibly large memory requirement for today's standards. The accuracy of the sine calculation has to be reduced to 16 bits for this reason by using only the upper 16 bits of the 34 bit values from the VCO. This reduced accuracy is then no longer sufficient to prevent the quantization effects.

The generation of the transmitting frequency and the first LO frequency by means of NCOs is explained below.

The inventive DDS generator 16y comprises one or more NCOs for generating the transmitting frequency, e.g. two, namely NCO1 21a and NCO2 21b and one single $NCO_L$ 22 for generating the first LO frequency $f_{LO1}$. NCO1 is permanently switched on and supplies the reference phase for synchronizing the phases of the other NCOs if required. This is effected with the two switches 23a and 23b which allow a transfer of the current phase of the NCO1 to the other NCOs.

There are special NMR experiments wherein during the transmitting phase, the frequency has to be switched from one value $f_1$ to a new value $f_2$ and back to the old value $f_1$. This could be realized with one single NCO if same would be switched as shown in FIG. 6a and 6b. The initial phase of $f_1$ would thereby get lost and would cause phase problems during the receiving phase.

Figure 7A:
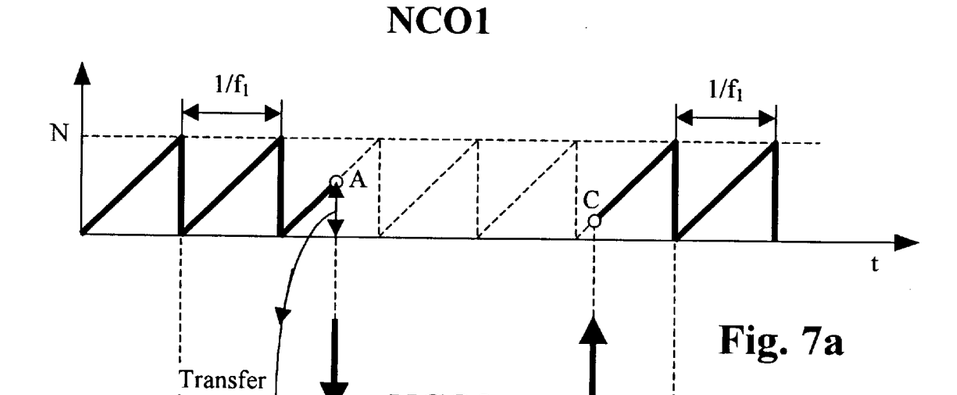
FIG. 7a shows the output signal of the NCO1 with a frequency f1.
Figure 7B:
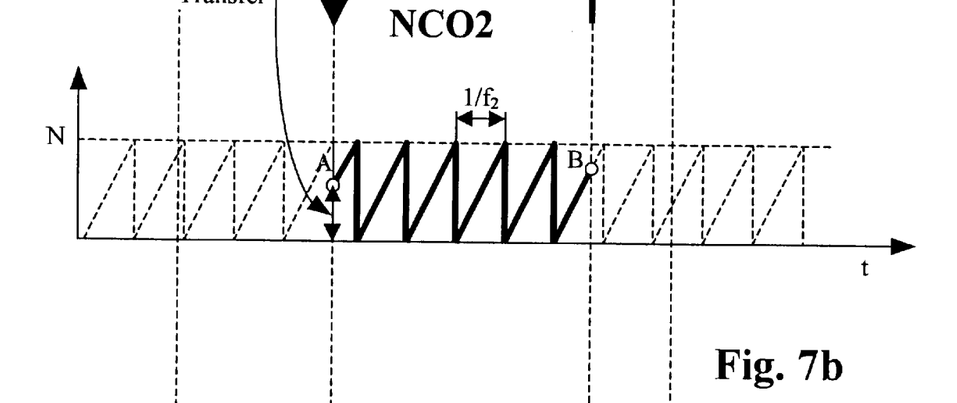
FIG. 7b shows the output signal of the NCO2 with a frequency f2.
Figure 7C:
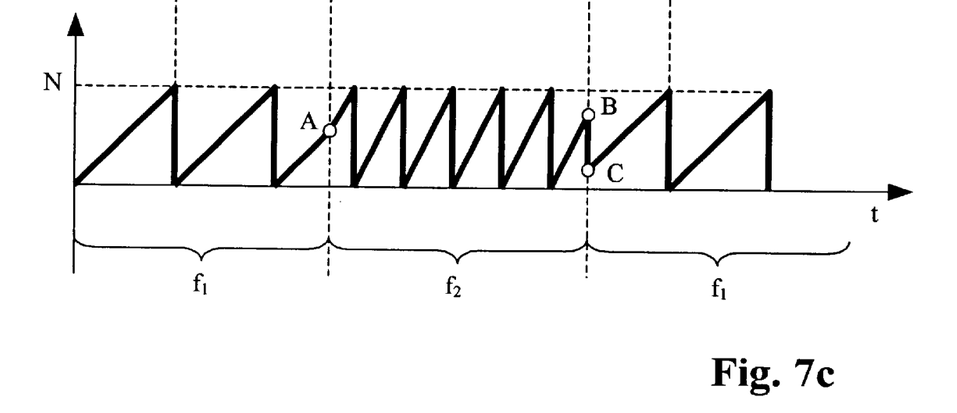
FIG. 7c shows the total signal of FIGS. 7a and 7b.

If two NCOs are used for the above-described experiment, namely NCO1 for the frequency $f_1$ and NCO2 for the frequency $f_2$, the original phase of $f_1$ does not get lost since the output is switched back to the original NCO1 which in the meantime continued its oscillation without any disturbance. When switching from $f_1$ to $f_2$, the phase of $f_1$ can be transferred to $f_2$ by means of the switch 23a thereby preventing a phase jump during switching. This is advantageous in that the experiment gives purer results. FIGS. 7a, 7b and 7c show the described processes for a better visual understanding.

The LO frequency $f_{LO1}$ is generated by means of the $NCO_L$ 22 which must have a higher spectral purity and is thus controlled with the inventive Z values. At the beginning of each acquisition process, i.e. detection of the FID (=Free Induction Decay), the phase of the reference oscillator NCO1 21a must be transferred to the $NCO_L$ via the switch 23b to produce phase-synchronous FIDs which can be summed up in the computer 15.

The entire spectrometer can be again represented by the block diagram in FIG. 2. This is true for prior art and also for the inventive circuit. The individual components have already been described in connection with prior art.

The main transmitting unit T1 is shown in FIG. 4 and explained in detail below:

4y main transmitting unit T1

16y DDS generator 17y frequency synthesizer which allows frequency changes in steps of $f_0$ (e.g. 5 MHz). These are generated by means of the PLL oscillator 38 (PLL=Phase Lock Loop) and defined with the numerical value $Z_G$ 19 attenuator for adjusting the output power of the generated signal 20 switch for selecting the transmitting frequency $f_{x1}$ during the transmitting phase and the LO frequency $f_{LO1}$ during the receiving phase 21a NCO which oscillates permanently and provides the reference phase for the two other NCOs 21b and 22. This NCO and the NCO 21b generate the desired transmitting frequency for the excitation pulse 21b NCO for generating, together with the NCO 21a, the desired transmitting frequency for the excitation pulse 22 NCO for generating the first LO frequency $f_{LO1}$ 23a, 23b switch for transferring the reference phase of the NCO 21a to the to NCOs 21b and 22

24 switch for selecting the desired NCO 25 summation stage for adding a phase correction in order to correct the phase error of the attenuator 19

26a, 26b two signal transformers which convert the incoming saw-tooth shaped signal into a sinusoidal or cosine function 27a, 27b two multiplicators for defining the amplitude dependence of the two sinusoidal signals 28a, 28b two digital to analog converters for converting the digital signals into analog signals 29 switch which is coupled with switch 24 and with which the desired attenuation value for the attenuator 19 is defined. Depending on whether NCO1, NCO2 or NCO$_L$ has been selected by switch 24, the corresponding attenuation value P1, P2 or P$_L$ is selected by said switch 29.

30a RAM memory which contains the phase errors of the attenuator 19 as a function of the desired attenuation value 30b RAM memory which contains the attenuation errors of the attenuator 19 as a function of the desired attenuation value 31 switch for switching the amplitude modulation a(t) on or off. In the switched off state, the value 0 is supplied to the multiplicators 27a and 27b causing them to pass on the value 0 and achieving thereby a complete suppression of the signals 32a, 32b two low-pass filters which are required in every sampling process for suppressing the clock frequency f$_s$ and its harmonics and the mirror frequencies generated by the clock frequency 33a, 33b quadrature mixing stage for upward mixing of the signal by the value of the LO frequency f$_1$ (e.g. 160 MHz)

35 adding stage which belongs to the quadrature mixing stage 33a, 33b 36 mixing stage for upward mixing of the signal by the value of the LO frequency f$_2$ (e.g. 720 MHz)

37 mixing stage using an LO frequency supplied by a PLL oscillator 38 which supplies multiple values of f$_0$ and by means of which the signal is further downwardly mixed or if required upwardly mixed 38 PLL oscillator for generating the LO frequency for the mixing stage 37. The LO frequency can be adjusted e.g. between 865 and 1500 MHz in steps of f$_0$=5 MHz wherein the desired setting is effected through the numerical value Z$_G$.

We claim:

1. A method of operating an NMR (nuclear magnetic resonance) spectrometer to obtain a bandwidth ΔB of high spectral purity, the method comprising the steps of:

a) implementing a DDS (direct digital synthesis) generator;

b) incorporating an NCO (numerical controlled oscillator) within said DDS for generating an LO (local oscillation) frequency, said NCO having a clock frequency f$_s$ a numerical input Z, and an output frequency f$_{out}$; and c) selecting said input Z to satisfy the relationship Z=n·N/m, wherein Z, n, N, and m are positive integers, N being a power of 2 with a positive integer exponent, said exponent representing a maximum number of bits during a calculation process, wherein m is approximately 2·fs/ΔB, n approximately m·f$_{out}$/f$_s$ and m is a common integer divisor of n·N.

2. The method of claim 1, wherein the NMR spectrometer is a high resolution spectrometer.

3. The method of claim 1, wherein said LO frequency is a first LO frequency f$_{LO1}$.

4. The method of claim 1, wherein m is a power of 2 having a positive integer exponent.

5. The method of claim 4, wherein step c) comprises the steps of:

C1) the determining m by means of the equation $$m=2^{RndDwn\{log[2fs/\Delta B]/log\ 2]\}}$$

wherein RndDwn is a rounding-off process to a next smaller integer value;

C2) calculating n following step C1), using the equation $$n=Rnd(m \cdot f_{out}/f_s)$$

wherein Rnd is a rounding process to a next integer value; and

C3) specifying Z=n·N/m following steps C1) and C2).

6. An NMR (nuclear magnetic resonance) spectrometer having a bandwith ΔB of high spectral purity, the spectrometer comprising:

means for implementing a DDS (direct digital synthesis) generator;

means for incorporating an NCO (numerical controlled oscillator) within said DDS for generating an LO (local oscillation) frequency, said NCO having a clock frequency f$_s$, a numerical input Z, and an output frequency f$_{out}$; and means for selecting said input Z to satisfy the relationship Z=n·N/m, wherein Z, n, N, and m are positive integers, N being power of 2 with a positive integer exponent, said exponent representing a maximum number of bits during a calculation process, wherein m is approximately 2·fs/ΔB, n approximately m·f$_{out}$/f$_s$ and m is a common integer divisor of n·N.

7. The NMR spectrometer of claim 6, wherein said incorporating means comprise a first NCO (=Numerical Controlled Oscillator) for generating said LO (=Local Oscillator) frequency f$_{LO1}$, at least one second NCO, for generating a transmitting frequency, and means for switching said first and siad second NCO between a receiving phase and a transmitting phase.

8. The spectrometer of claim 7, wherein said selecting means comprise for determining m using an equation m=2$^{RndDwn\{log[2fs/\Delta B)/log\ 2]\}}$ wherein RndDwn is a rounding-off process to a next smaller integer value, means of calculating n using an equation n=Rnd(m·f$_{out}$/f$_s$) wherein Rnd is a rounding process to a next integer value, and means for specifying Z=n·N/m.

9. The spectrometer of claim 7, wherein the NMR spectrometer is a high resolution NMR spectrometer.

10. The spectrometer of claim 7, wherein said first NCO has a clock frequency f$_s$ which satisfies the condition f$_s$=2$^k$·f$_0$, wherein k is a position integer and f$_0$ is a base frequency from which all LO frequencies are derived as integer multiples of f$_0$ with the exception of a frequency f$_{LO1}$ for a mixing stage and a frequency f$_{dqd}$ for a DQD (=digital quadrature detector).

11. A method of operating the spectrometer of claim 10, wherein, during a receiving phase, an exact positioning of an NMR spectrum in a low frequency range is not effected via an NCO rather by means of a numerical value Z$_Q$ in a DQD.

12. The spectrometer of claim 7, wherein one of said first and said at least one second NCO oscillates continuously, and further comprising switches for transferring an actual phase of said continuously oscillating NCO to other NCOS for providing a reference phase.

13. The spectrometer of claim 7, further comprising a saw-tooth to sine signal transformer in which a saw-tooth signal of an NCO is transformed from a saw-tooth to a sinussoidal signal, and with a saw-tooth to cosine signal transformer in which said a saw-tooth signal of said NCO is transformed from a saw-tooth to a cosine signal, wherein two channels is quadrature are thereby produced for a downstream frequency synthesizer in a quadrature mixing stage.

14. A spectrometer of claim 7, further comprising multiplicators into which signals from signal transformers pass for mathematically generating a desired amplitude dependence during a transmitting phase.

15. The spectrometer of claim 7, further comprising an attenuator whose phase and anntuation errors can be compensated by storing said phase errors as a function of a desired attenuation value in a first memory and by storing attenuation errors as a function of a desired attenuation value, an associated phase error is added with reverse sign to a current signal in an adding stage and a corresponding attenuation error is added with reverse sign to a desired attenuation value and supplied to an attenuator.

* * * * *